(12) United States Patent
Seo et al.

(10) Patent No.: US 11,499,844 B2
(45) Date of Patent: Nov. 15, 2022

(54) ENVIRONMENTAL COMPENSATION METHOD IN PROXIMITY SENSOR AND PROXIMITY SENSOR HAVING IMPROVED ENVIRONMENTAL COMPENSATION PERFORMANCE

(71) Applicant: ABOV Semiconductor Co., Ltd., Cheongju-si (KR)

(72) Inventors: Young Jin Seo, Seoul (KR); Seo Han Lee, Seoul (KR); Jeong Hwan Seo, Anyang-si (KR)

(73) Assignee: ABOV Semiconductor Co., Ltd., Cheongju-si (KR)

( * ) Notice: Subject to any disclaimer, the term of this patent is extended or adjusted under 35 U.S.C. 154(b) by 176 days.

(21) Appl. No.: 17/015,341

(22) Filed: Sep. 9, 2020

(65) Prior Publication Data
US 2022/0034683 A1  Feb. 3, 2022

(30) Foreign Application Priority Data
Jul. 30, 2020  (KR) .................. 10-2020-0095438

(51) Int. Cl.
| | | |
|---|---|---|
| G01D 5/24 | (2006.01) | |
| G01K 13/00 | (2021.01) | |
| G01N 27/22 | (2006.01) | |

(52) U.S. Cl.
CPC .............. G01D 5/24 (2013.01); G01K 13/00 (2013.01); G01N 27/223 (2013.01)

(58) Field of Classification Search
CPC .. G01D 5/00; G01D 5/12; G01D 5/14; G01D 5/24; G01D 3/00; G01D 3/028;
(Continued)

(56) References Cited

U.S. PATENT DOCUMENTS

| | | | | |
|---|---|---|---|---|
| 2008/0047764 A1* | 2/2008 | Lee | ................. | G06F 3/0418 |
| | | | | 178/18.06 |
| 2016/0179285 A1* | 6/2016 | Lee | ................. | G06F 3/0445 |
| | | | | 345/174 |
| 2021/0034195 A1* | 2/2021 | Lee | ................. | G06F 3/0418 |

FOREIGN PATENT DOCUMENTS

| | | |
|---|---|---|
| KR | 10-2006-0130795 A | 12/2006 |
| KR | 10-1012305 B1 | 2/2011 |
| | (Continued) | |

OTHER PUBLICATIONS

Machine Translation of KR 20200033591 A (Year: 2022).*
(Continued)

*Primary Examiner* — Hoai-An D. Nguyen
(74) *Attorney, Agent, or Firm* — Fenwick & West LLP

(57) ABSTRACT

A proximity sensor having improved environmental compensation performance and an environmental compensation method in the proximity sensor are disclosed. The environmental compensation method and the proximity sensor advantageously reduce processing time, algorithm operation time, and power consumption by previously setting sensing values before sensing of sensors unlike a typical method in which compensation is carried out by multiplying factors obtained through software. Further, the environmental compensation method and the proximity sensor have an advantage of accurate compensation not only for linearly varying environmental factors but also non-linearly varying environmental factors.

12 Claims, 5 Drawing Sheets

(58) Field of Classification Search
CPC ...... G01D 3/036; G01D 3/0365; G01N 27/00; G01N 27/02; G01N 27/22; G01N 27/223; G01K 13/00; H03K 17/00; H03K 17/94; H03K 17/945; H03K 17/96; H03K 17/962; H03K 2217/00; H03K 2217/94; H03K 2217/9401; H03K 2217/94015; H03K 2217/94021; H03K 2217/94026; H03K 2217/94031; G06F 3/00; G06F 3/01; G06F 3/03; G06F 3/041; G06F 3/0416; G06F 3/0418; G06F 3/044

See application file for complete search history.

(56) References Cited

FOREIGN PATENT DOCUMENTS

| | | |
|---|---|---|
| KR | 10-2014-0023428 A | 2/2014 |
| KR | 10-2016-0143085 A | 12/2016 |
| KR | 10-2017-0068754 A | 6/2017 |
| KR | 10-2020-0033591 A | 3/2020 |

OTHER PUBLICATIONS

Machine Translation of KR 20160143085 A (Year: 2022).*
Korean Intellectual Property Administration, Office Action, KR Patent Application No. 10-2020-0095438, dated Sep. 29, 2020, six pages (with concise explanation of relevance).

* cited by examiner

ENVIRONMENTAL COMPENSATION METHOD IN PROXIMITY SENSOR AND PROXIMITY SENSOR HAVING IMPROVED ENVIRONMENTAL COMPENSATION PERFORMANCE

CROSS REFERENCE TO RELATED APPLICATION

This application claims priority under 35 U.S.C. § 119(a) to Republic of Korea Patent Application No. 10-2020-0095438, filed on Jul. 30, 2020, which is incorporated by reference herein in its entirety.

TECHNICAL FIELD

The present disclosure relates to a proximity sensor and, more particularly, to an environmental compensation method in a proximity sensor, which can secure accurate touch sensing in the proximity sensor, and a proximity sensor having improved environmental compensation performance.

BACKGROUND ART

In recent years, management of harmful electromagnetic waves from an electronic device such as a smartphone and the like becomes an important issue and a proximity sensor (GRIP Sensor; Proximity; SAR Sensing) is used as one means for management of such electromagnetic waves.

Since a user face is exposed to harmful electromagnetic waves in use of a smartphone for phone calling, electric power causing generation of electromagnetic waves is controlled through detection of proximity between the user face and the smartphone.

In the related art, when temperature of the proximity sensor continues to increase due to phone calling for a long period of time, capacitance of a plurality of capacitors disposed inside the proximity sensor to constitute a touch sensor adapted to sense proximity (or gripping) of or touch of a user also increases.

Since capacitance reactance is decreased with increasing capacitance, frequencies and sensing values of the touch sensor are increased. The increased sensing values of the touch sensor can cause failure in determination as to a degree of proximity and proximity release.

In order to solve such a problem, there is proposed a technique of using a separate reference channel for compensation for the sensing values of the touch sensor when a user grips the smartphone.

However, this technique still has a problem of deterioration in accuracy in touch and proximity sensing upon increase in temperature due to phone calling for a long period of time, particularly, in a state in which the electronic device is placed near the user face, and a problem of increase in area of a touch IC (integrated circuit) or power consumption due to maintenance of the separate reference channel which is not actually involved in touch operation.

Moreover, there is a possibility of malfunction when temperature variation of the reference channel is not consistent with temperature variation of a main channel.

SUMMARY OF THE INVENTION

Embodiments of the present disclosure provide an environmental compensation method in a proximity sensor and a proximity sensor having improved environmental compensation performance.

In accordance with one embodiment of the present disclosure, an environmental compensation method in a proximity sensor includes: sensing, by a first sensor, a first sensing value; sensing, by a second sensor, a second sensing value; preprocessing the second sensing value; sensing, by a third sensor, a third sensing value; preprocessing the third sensing value; compensating for the first sensing value by adding or subtracting the preprocessed second sensing value with respect to the first sensing value; and re-compensating for the first sensing value by adding or subtracting the preprocessed third sensing value with respect to the compensated first sensing value.

Each of the second sensor and the third sensor may be provided in plural to allow each of preprocessing the second sensing value, preprocessing the third sensing value, compensating for the first sensing value, and re-compensating for the first sensing value to be performed plural times.

The first sensor may be a touch sensor; the second sensor may include an internal sensor adapted to sense internal environmental factors around a processor disposed inside the proximity sensor; and the third sensor may include an external sensor adapted to sense external environmental factors outside the proximity sensor.

Preprocessing the sensing values may be performed based on previously stored compensation values.

Preprocessing the sensing values may be performed using a compensation table including the previously stored compensation values and the compensation table may store different compensation values depending upon a degree of environmental variation.

The second sensor and the third sensor may be spatially separated from each other so as to sense different environmental variations.

In accordance with another embodiment of the present disclosure, a proximity sensor having improved environmental compensation performance includes: a processor; and a non-temporary memory storing a command, wherein, when operated by the processor, the command cause the processor to be configured to: sense, by a first sensor, a first sensing value; sense, by a second sensor, a second sensing value; preprocess the second sensing value; sense, by a third sensor, a third sensing value; preprocess the third sensing value; compensate for the first sensing value by adding or subtracting the preprocessed second sensing value with respect to the first sensing value; and re-compensate for the first sensing value by adding or subtracting the preprocessed third sensing value with respect to the compensated first sensing value.

Each of the second sensor and the third sensor may be provided in plural to allow each of preprocessing the second sensing value, preprocessing the third sensing value, compensating for the first sensing value, and re-compensating for the first sensing value by the processor to be performed plural times.

The first sensor may be a touch sensor; the second sensor may include an internal sensor adapted to sense internal environmental factors around the processor disposed inside the proximity sensor; and the third sensor may include an external sensor adapted to sense external environmental factors outside the proximity sensor.

Preprocessing the sensing values by the processor may be performed based on previously stored compensation values.

The proximity sensor may further include a compensation table including the previously stored compensation values, wherein the compensation table stores different compensation values depending upon a degree of environmental variation.

The second sensor and the third sensor may be spatially separated from each other so as to sense different environmental variations.

In accordance with a further embodiment of the present disclosure, an environmental compensation method of a proximity sensor includes: sensing, by a first sensor, a first sensing value; sensing, by at least one second sensor, at least one second sensing value; and compensating for the first sensing value by adding or subtracting the preprocessed second sensing value with respect to the first sensing value, wherein sensing the second sensing value may include adjusting at least one sensor feature selected from among a sensing time, a sensing cycle, and a gain of the second sensor using at least one setting value for compensation for environmental variation before sensing by the second sensor.

The second sensor may be provided in plural such that the second sensors are spatially separated from each other so as to sense different environmental variations.

The first sensor may be a touch sensor; and the plural second sensors may include an internal sensor adapted to sense internal environmental factors around a processor disposed inside the proximity sensor, and an external sensor adapted to sense external environmental factors outside the proximity sensor.

Adjusting at least one sensor feature may be performed using a setting table having previous stored setting values, and the setting table may store different setting values depending upon a degree of environmental variation.

In accordance with yet another embodiment of the present disclosure, a proximity sensor having improved environmental compensation performance includes: a processor; and a non-temporary memory storing a command, wherein, when operated by the processor, the command cause the processor to be configured to: sense, by a first sensor, a first sensing value; sense, by at least one second sensor, at least one second sensing value; and compensate for the first sensing value by adding or subtracting the preprocessed second sensing value with respect to the first sensing value, wherein sensing the second sensing value comprises: adjusting at least one sensor feature selected from among a sensing time, a sensing cycle, and a gain of the second sensor using at least one setting value for compensation for environmental variation before sensing by the second sensor.

The second sensor may be provided in plural such that the second sensors are spatially separated from each other so as to sense different environmental variations.

The first sensor may be a touch sensor; and the plural second sensors may include an internal sensor adapted to sense internal environmental factors around the processor disposed inside the proximity sensor, and an external sensor adapted to sense external environmental factors outside the proximity sensor.

Adjusting at least one sensor feature by the processor may be performed using a setting table having previous stored setting values, and the setting table may store different setting values depending upon a degree of environmental variation.

According to embodiments of the present disclosure, the environmental compensation method in the proximity sensor and the proximity sensor having improved environmental compensation performance do not employ a separate reference channel causing a problem of increase in area of a touch IC or power consumption.

In the environmental compensation method in the proximity sensor and the proximity sensor having improved environmental compensation performance according to the embodiments of the present disclosure, multistage compensation is performed through division according to environmental factors, thereby enabling more accurate determination on proximity of a user.

The environmental compensation method and the proximity sensor according to the embodiments of the present disclosure advantageously reduce processing time, algorithm operation time, and power consumption by previously setting sensing values before sensing of sensors unlike a typical method in which compensation is carried out by multiplying coefficients obtained through software.

The environmental compensation method and the proximity sensor according to the embodiments of the present disclosure advantageously allow accurate compensation not only for linearly varying environmental factors but also non-linearly varying environmental factors.

BRIEF DESCRIPTION OF THE DRAWINGS

Figures (FIGS. 1A thorough 1C are conceptual views of environmental factor compensation using a multistage compensation method according to one embodiment of the present disclosure.

DETAILED DESCRIPTION OF THE INVENTION

Figure 1A:
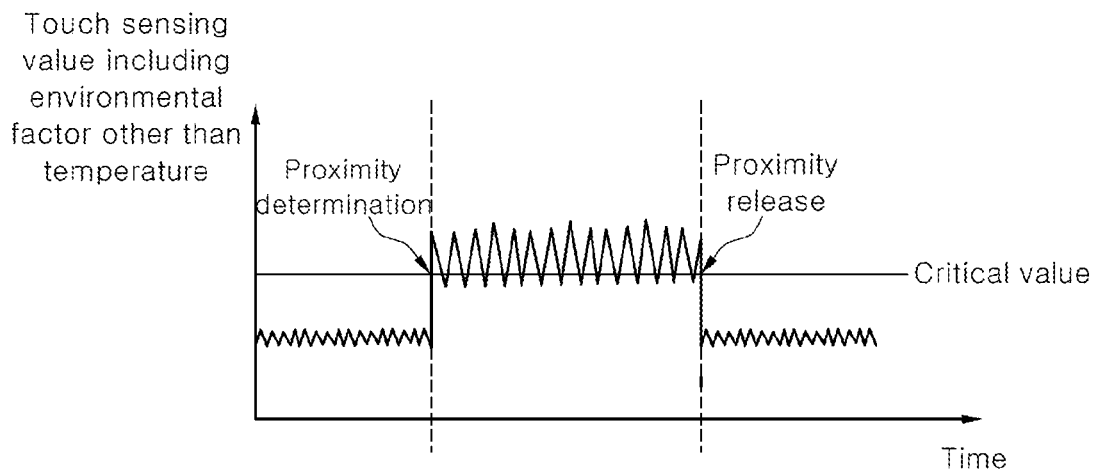

Hereinafter, embodiments of the present disclosure will be described in detail with reference to the accompanying drawings so as to fully convey the spirit of the present disclosure to those skilled in the art. Detailed description of known functions and constructions which can unnecessarily obscure the subject matter of the present disclosure will be omitted. In addition, like elements having the same or similar functions will be denoted by the same reference numerals throughout the drawings.

According to the present disclosure, environmental factors include temperature, humidity, noise, dust, and the like. Such environmental factors can cause linear or non-linear variation of touch sensing values of a proximity sensor and an error in touch sensing values.

Therefore, the present disclosure is aimed at obtaining accurate touch sensing values through compensation for errors due to various environmental factors.

An environmental compensation method according to a certain embodiment of the present disclosure includes performing multistage compensation for each of environmental factors of a proximity sensor. For example, primary compensation is performed for temperature of the proximity sensor, which is a main environmental factor thereof, and secondary compensation is performed for other environmental factors thereof excluding the temperature based on the compensated result in order to improve accuracy of a touch sensing value. Alternatively, primary compensation may be performed for other environmental factors excluding the temperature and secondary compensation may be performed for the temperature. According to the present disclosure, individual compensation may be performed for each of the environmental factors and the sequence of compensation may be changed.

Conventionally, all of the environmental factors are compensated through a single compensation operation instead of individual compensation for each of the environmental factors unlike the present disclosure.

In addition, additional compensation may be individually performed depending upon the environmental factors and different compensations may be sequentially repeated.

According to a certain embodiment, a plurality of environmental factor sensors adapted to sense a plurality of environmental factors may be used in order to compensate for sensing values of one touch sensor.

According to a certain embodiment, a single touch sensor and a single environmental factor adapted to sense a single environmental factor may be used as a pair.

According to a certain embodiment, an internal environmental factor and an external environmental factor in the proximity sensor may be separately compensated for.

According to a certain embodiment, compensation may be performed based on a compensation table that stores different compensation values depending upon the degree of variation of environmental factors, such as temperature or noise.

According to a certain embodiment, the environmental compensation method may include adjusting at least one sensor feature selected from among a sensing time, a sensing cycle, and a gain of the environmental factor sensor based on at least one setting value for compensation for environmental variation before sensing by the environmental factor sensor disposed inside the proximity sensor.

That is, adjusting the sensor feature may be performed before compensation and before sensing by the sensor.

Figure 1B:
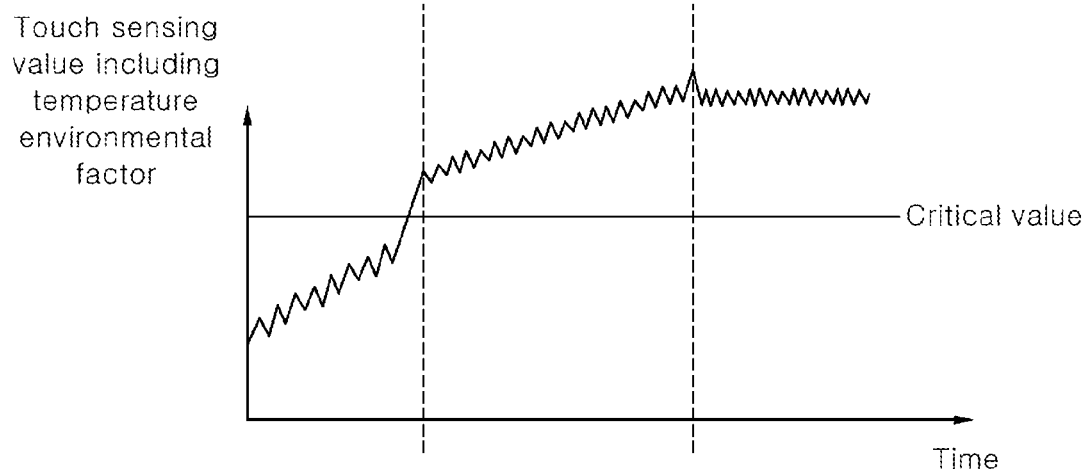
Figure 1C:
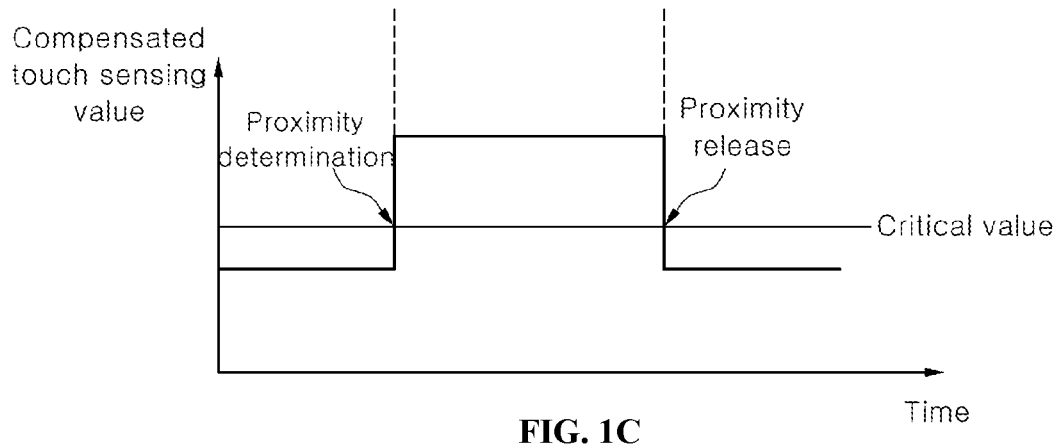

FIGS. 1A through 1C is a conceptual view of environmental factor compensation using a multistage compensation method according to one embodiment of the present disclosure.

As described above, the environmental compensation method according to the present disclosure includes performing multistage compensation for each of environmental factors of the proximity sensor. For example, primary compensation is performed for temperature of the proximity sensor, which is a main environmental factor thereof, and secondary compensation is performed for other environmental factors excluding the temperature based on the compensated result in order to improve accuracy of a touch sensing value. Alternatively, primary compensation may be performed for other environmental factors excluding the temperature and secondary compensation may be for the temperature. Additional compensation may be further performed for the other environmental factors.

FIG. 1A is a conceptual graph depicting time-dependent sensing values of a touch sensor including sensing values of environmental factors (for example, humidity, noise of proximity sensor, dust, and the like) other than temperature.

FIG. 1A is a conceptual graph depicting an error of touch sensing based on environmental factors other than temperature. That is, since a touch sensing value can increase or decrease near a critical value due to noise by the environmental factors other than the temperature after proximity determination, plural sensing values of proximity release and proximity determination are output several times before actual proximity release, thereby causing an error of the proximity sensor. FIG. 1A shows an extremely emphasized case for better understanding.

FIG. 1B is a conceptual graph depicting an error of touch sensing by a temperature environmental factor. Sensing of temperature may be carried out by a suitable temperature sensor. According to the present disclosure, the sensor for temperature sensing may include, for example, a capacitive temperature sensor, an ADC type temperature sensor, a temperature sensor using a proportional to absolute temperature (PTAT) voltage generation circuit and ADC, and the like.

The sensing values of the touch sensor linearly or non-linearly increase due to the temperature environmental factor, thereby making it difficult to determine an accurate time point for proximity release. FIG. 1B shows sensing values of the touch sensor based on the temperature environmental factor that linearly increases.

FIG. 1C is a conceptual graph depicting a compensation result obtained through primary compensation for the sensing values of touch sensing based on the other environmental factors excluding the temperature, as shown in FIG. 1A, and secondary compensation for the sensing values of touch sensing based on the temperature environmental factor, as shown in FIG. 1B. As described above, the sequence of compensation may be changed depending upon the sensing values of the environmental factors or according to a predetermined reference.

FIG. 1C shows ideal touch sensing values indicating an accurate proximity determination time and an accurate proximity release time.

Figure 2:
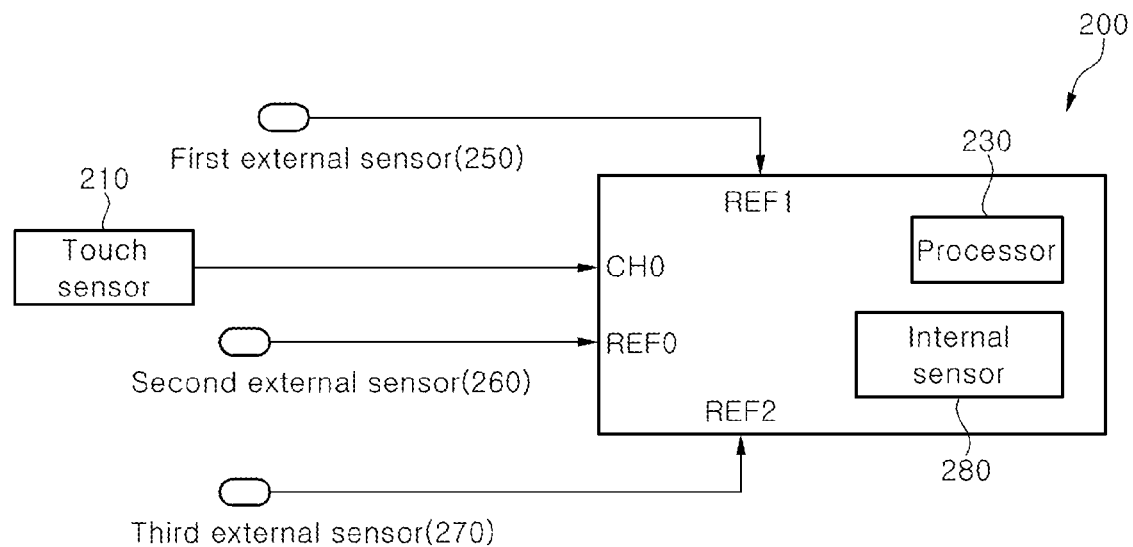
FIG. 2 is a view of a proximity sensor having improved environmental compensation performance according to a first embodiment of the present disclosure.

FIG. 2 is a view of a proximity sensor having improved environmental compensation performance according to a first embodiment of the present disclosure.

Referring to FIG. 2, the proximity sensor 200 according to the first embodiment includes a plurality of external sensors 250, 260, 270 and one internal sensor 280 for one touch sensor 210.

The present disclosure is aimed at obtaining, for example, a compensated touch sensing value of FIG. 1C by compensating for touch sensing values of one touch sensor 210 shown in FIG. 2 using sensing values of the plurality of sensors.

The internal sensor commonly refers to a sensor that senses environmental factors around a processor 220, for example, an internal temperature sensor 280 adapted to sense temperature variation around the processor. Although one internal sensor is shown in FIG. 2, it should be understood that the proximity sensor may include a plurality of internal sensors.

The external sensor commonly refers to a sensor adapted to sense environmental factors in a region physically or spatially separated from a space (for example, an internal space) including the processor therein. For example, a first external sensor 250 may be a humidity sensor, a second external sensor 260 may be a dust sensor, and a third external sensor 270 may be an external temperature sensor adapted to sense variation in external temperature of the space in which the processor is placed.

According to other embodiments, the external sensors may include various sensors:

(1) A humidity sensor that allows compensation for the touch sensing values by sensing increase in capacitance due to moisture. For example, when the proximity sensor is wet by or immersed in water, the humidity sensor senses this result and allows compensation for the touch sensing values;

(2) A gyro sensor or acceleration sensor that senses movement of a device and allows reduction in power consumption based on determination as to whether a user carries or uses the device;

(3) A pressure sensor that senses physical variation with respect to a device and allows compensation upon proximity determination;

(4) A magnetic sensor (for example, a Hall sensor) that may be used when other objects excluding a human approach the sensor; and (5) An infrared sensor, ultrasound sensor or illumination sensor, which provides reference data for determination as to proximity to an object. Here, the reference data serve to determine whether proximity determination of the sensor is correct or incorrect.

Multistage compensation for the touch sensing values of the touch sensor 210 is performed in a predetermined sequence that secures optimal touch sensing values or in the sequence of magnitudes of sensing values of each sensor.

Multistage compensation of the touch sensor 210 may be performed by a multistage compensation method illustrated in FIGS. 1A through 1C or a flowchart described below in detail with reference to FIG. 6.

Figure 3:
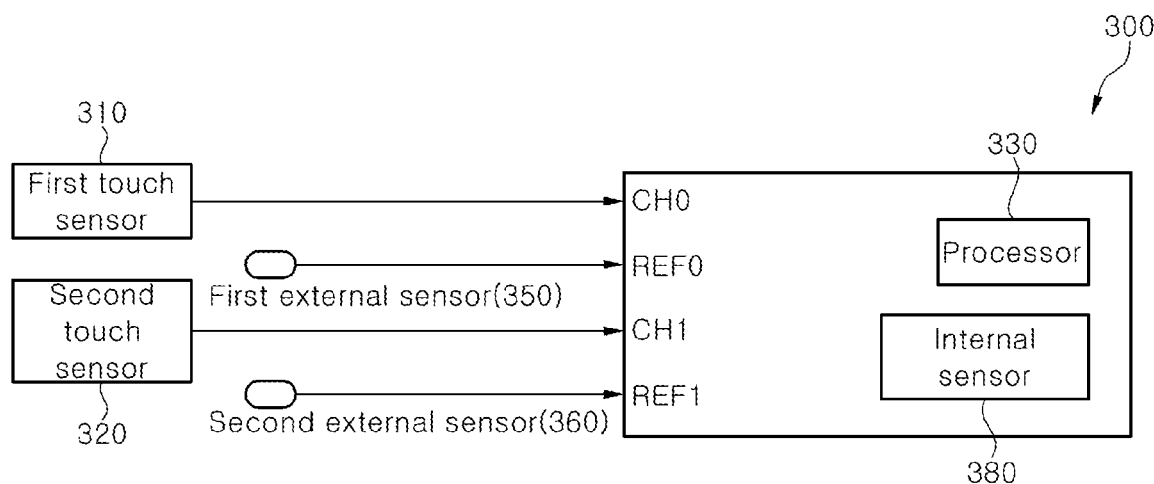
FIG. 3 is a view of a proximity sensor having improved environmental compensation performance according to a second embodiment of the present disclosure.

FIG. 3 is a view of a proximity sensor having improved environmental compensation performance according to a second embodiment of the present disclosure.

Referring to FIG. 3, the proximity sensor 300 according to the second embodiment includes external sensors, each of which is paired with each touch sensor. The proximity sensor 300 may further include an internal sensor 380 adapted to sense environmental factors around a processor 330.

A first touch sensor 310 is paired with a first external sensor 350 in order to compensate for touch sensing values of the first touch sensor 310 and a second touch sensor 320 is paired with a second external sensor 360 in order to compensate for touch sensing values of the second touch sensor 320.

Multistage compensation for the touch sensing values of the first touch sensor 310 may be performed through primary compensation based on sensing values of the first external sensor 350 and secondary compensation based on sensing values of the internal sensor 380.

Multistage compensation for the touch sensing values of the second touch sensor 320 may be performed through primary compensation based on sensing values of the second external sensor 360 and secondary compensation based on the sensing values of the internal sensor 380.

According to a certain embodiment of the present disclosure, the internal sensor may be provided in plural such that the internal sensors are combined with the external sensors, respectively, to perform multistage compensation for the touch sensing values of the touch sensors.

Figure 4:
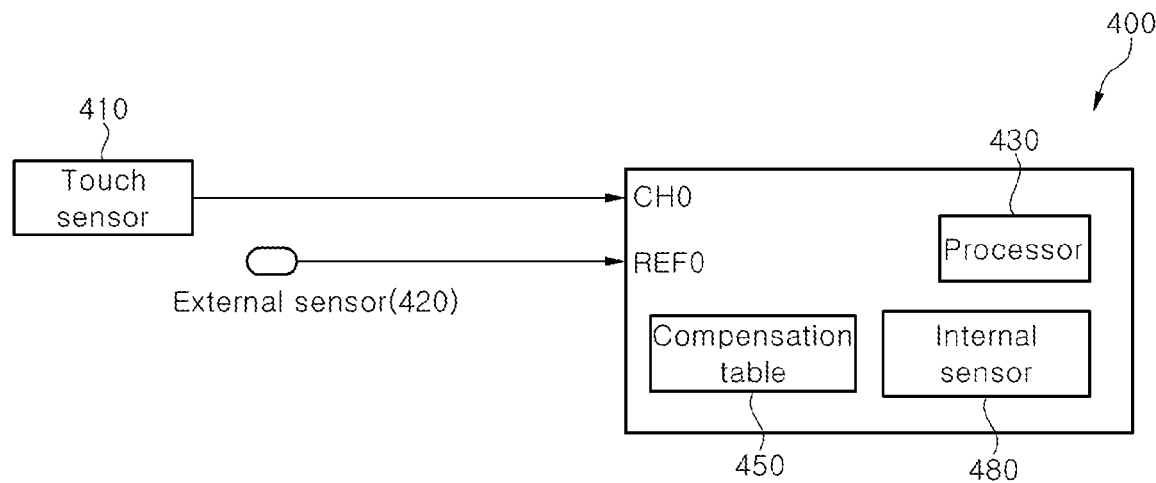
FIG. 4 is a view of a proximity sensor having improved environmental compensation performance according to a third embodiment of the present disclosure.

FIG. 4 is a view of a proximity sensor having improved environmental compensation performance according to a third embodiment of the present disclosure.

The proximity sensor shown in FIG. 4 is similar to the proximity sensors shown in FIG. 2 and FIG. 3 except that the proximity sensor according to the third embodiment includes a compensation table.

The compensation table 450 of FIG. 4 stores compensation values for a preprocessing step for compensation for the touch sensing values of the touch sensor 410.

When an external sensor 420 is, for example, a humidity sensor and there is a large deviation between a touch sensing value of the touch sensor and a sensing value of the humidity sensor, preprocessing is performed by multiplying the sensing value of the humidity sensor by a large coefficient value.

When an internal sensor 480 is, for example, a temperature sensor and a variation rate of a temperature sensing value is set, preprocessing is performed by multiplying the temperature sensing value by the inverse of the variation rate (for example, gain) as a coefficient value. Here, the gain is previously stored as a compensation value in the compensation table.

The compensation table stores different compensation values depending upon the degree of variation of the environmental factors, such as temperature or noise.

The proximity sensor according to this embodiment using the compensation table shown in FIG. 4 may also perform multistage compensation described with reference to FIG. 1A through FIG. 3 and described below in FIG. 6.

However, the proximity sensor according to this embodiment is different from the proximity sensors according to the above embodiments in that the compensation values are previously stored in the compensation table to be used in the preprocessing step.

Figure 5:
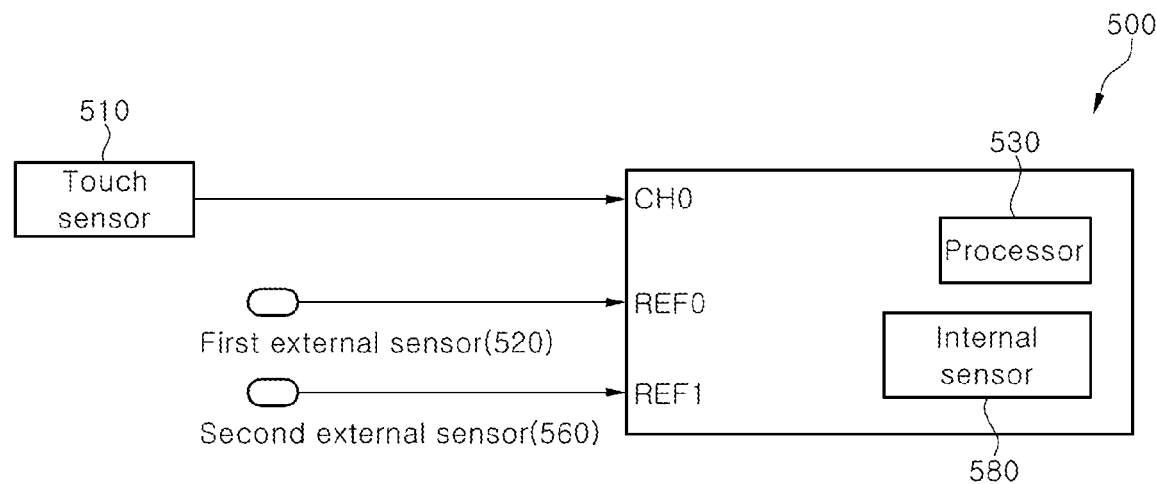
FIG. 5 is a view of a proximity sensor having improved environmental compensation performance according to a fourth embodiment of the present disclosure.

FIG. 5 is a view of a proximity sensor having improved environmental compensation performance according to a fourth embodiment of the present disclosure.

The proximity sensor according to the fourth embodiment shown in FIG. 5 is different from the proximity sensors shown in FIG. 2 to FIG. 4 in that the proximity sensor according to the fourth embodiment employs operation of a processor 530.

Figure 7:
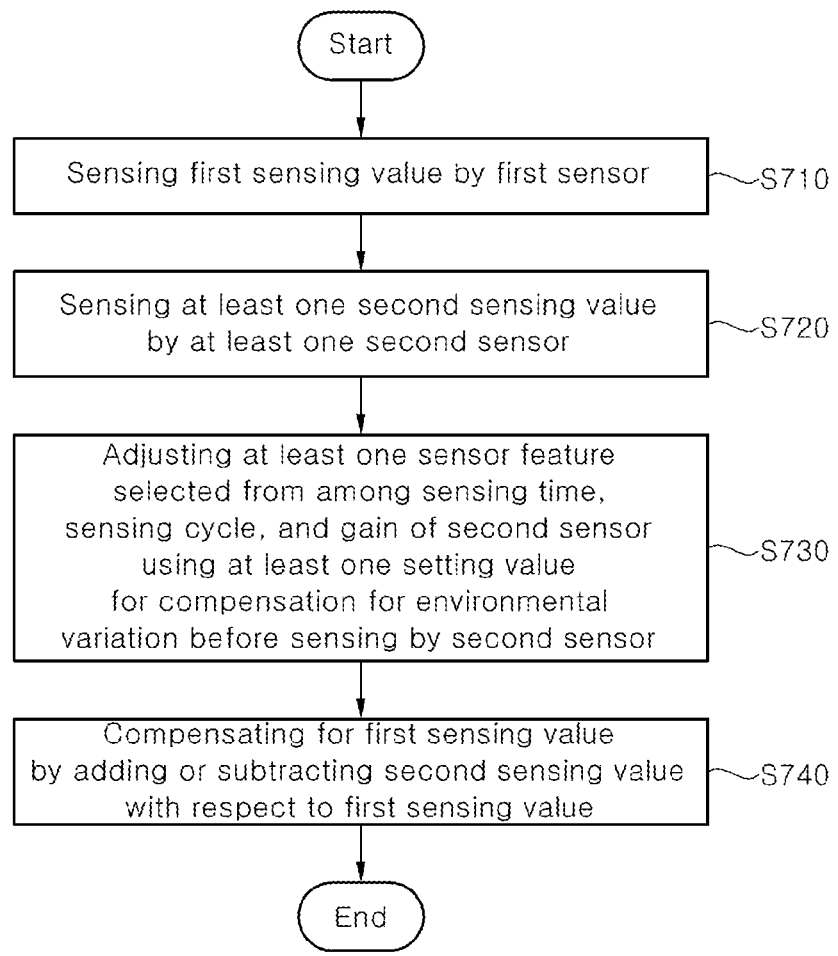
FIG. 7 is a flowchart of an environmental compensation method in a proximity sensor according to a second embodiment of the present disclosure.

In the proximity sensor according to this embodiment shown in FIG. 5, compensation of a touch sensor 510 may be performed according to a flowchart shown in FIG. 7.

Compensation for the touch sensing values of the touch sensors shown in FIG. 1A to FIG. 4 may include the step of preprocessing the sensing values of the external sensor and/or the internal sensor (for example, multiplying a coefficient value or digitalization). On the contrary, the proximity sensor according to this embodiment shown in FIG. 5 does not perform the step of preprocessing the sensing values of the sensors. Here, the processor 530 may adjust a sensor feature of each of the sensors.

The compensation method may further include the step of adjusting a sensing time, a sensing cycle, and/or a gain of the sensors based on at least one setting value for compensation for environmental variation before sensing by the sensors.

The step of adjusting may be performed by a separate component or by the processor 530 shown in FIG. 5.

In FIG. 5, compensation may be performed by adjusting a sensing condition based on at least one sensing value in hardware without performing the aforementioned preprocessing step.

The proximity sensor according to this embodiment may include a setting table (not shown) that previously stores the setting values. The setting table stores different setting values depending upon the degree of variation of the environmental factors, such as temperature or noise.

The values stored in the compensation table 450 of FIG. 4 are different from the values stored in the setting table of FIG. 5. Specifically, the compensation table 450 stores the compensation values for the preprocessing step, whereas the setting table stores the setting values for adjustment of the sensor features of the sensor.

Figure 6:
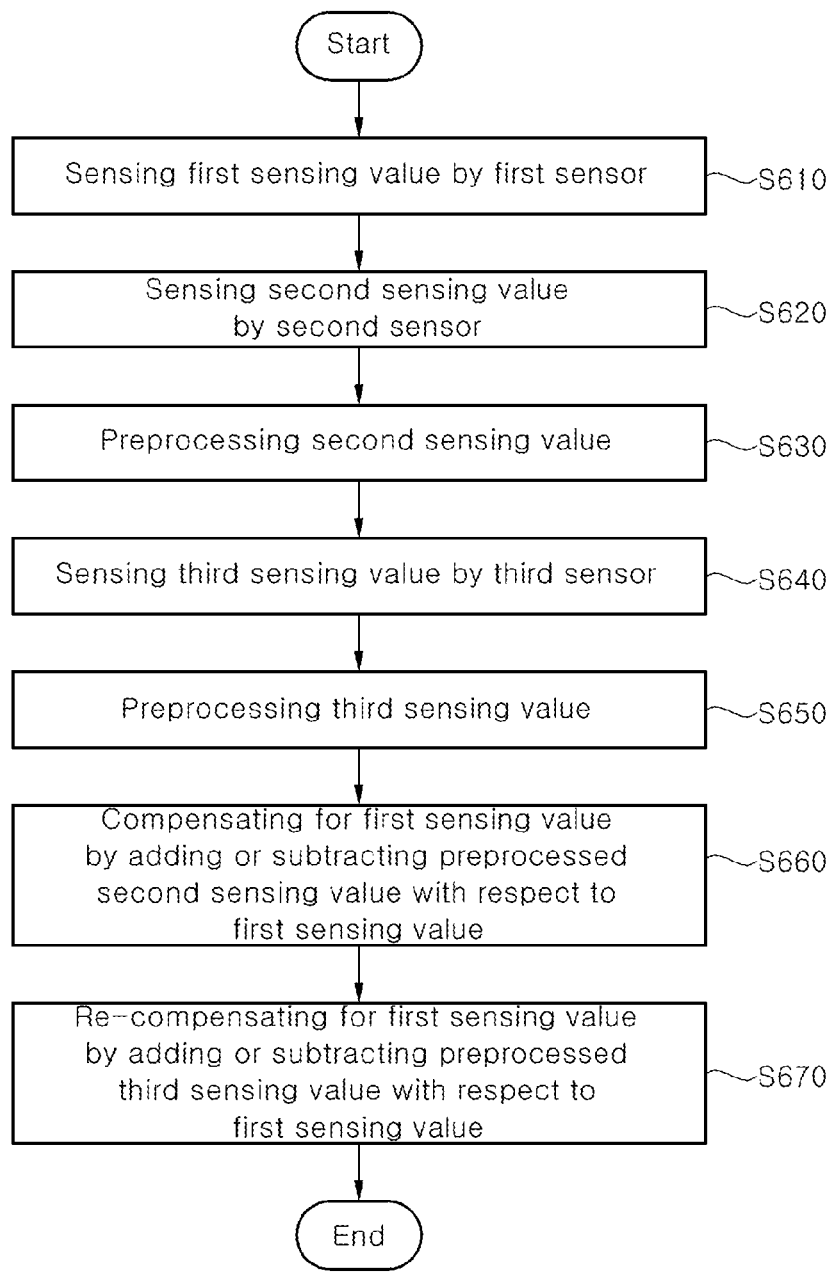
FIG. 6 is a flowchart of an environmental compensation method in a proximity sensor according to a first embodiment of the present disclosure.

FIG. 6 is a flowchart of an environmental compensation method in a proximity sensor according to a first embodiment of the present disclosure.

The flowchart shown in FIG. 6 is a flowchart for multistage compensation according to the present disclosure.

In S610, a first sensor (for example, a touch sensor) senses a first sensing value (for example, a touch sensing value).

In S620, a second sensor (for example, a temperature sensor) senses a second sensing value (for example, a temperature variation value).

In S630, the second sensing value is preprocessed. In S630, pre-processing may include all calculation or processing with respect to the second sensing value, which is performed before compensation for the touch sensing value. Specifically, preprocessing may include multiplying the second sensing value by a coefficient value or converting the second sensing value into a digital value in order to achieve optimal compensation for a temperature variation value.

In S640, a third sensor (for example, a sensor adapted to sense an environmental factor other than a temperature sensor) senses a third sensing value (for example, a humidity variation value).

In S650, the third sensing value is preprocessed. Preprocessing of the third sensing value may include all calculation or processing with respect to the third sensing value in order to achieve optimal compensation for a temperature variation value as in preprocessing of the second sensing value.

In S660, the first sensing value (for example, a touch sensing value) is compensated by adding or subtracting the preprocessed second sensing value with respect to the first sensing value.

Compensation in S660 means removal of variation in the touch sensing value by the temperature variation value and commonly refers to the procedure of removing an effect on the variation in the touch sensing value due to temperature variation in FIG. 1B.

In S670, the first sensing value is re-compensated by adding or subtracting the preprocessed third sensing value with respect to the compensated first sensing value. That is, re-compensation in S670 may mean removal of an effect of a touch sensing value from the compensated first sensing value due to variation in other environmental factors.

That is, a result value after completion of re-compensation in S670 may be an output signal having a compensated touch sensing value from which a variation value due to the sensed environmental factors is removed.

Although not specifically shown in FIG. 6, additional compensation for the temperature environmental factor may be further performed at least once and additional compensation for other environmental factors excluding temperature may be further performed at least once after re-compensation in S670.

In addition, additional compensation for the other environmental factors (for example, humidity) may be performed and the sequence of compensation can be changed according to the touch sensing value or other references.

FIG. 7 is a flowchart of an environmental compensation method in a proximity sensor according to a second embodiment of the present disclosure.

The flowchart shown in FIG. 7 is a flowchart for compensation for touch sensing values by the step of adjusting the sensor features in FIG. 6.

In S710, a first sensor (for example, a touch sensor 510) senses a first sensing value (for example, a touch sensing value).

In S720, at least one second sensor (for example, a first external sensor 520, a second external sensor 530, an internal sensor 580) senses at least one second sensing value (for example, a humidity variation value, a temperature variation value, noise of the sensor, and a dust detection value).

The step of sensing the second sensing value (S720) may include adjusting at least one sensor feature selected from among a sensing time, a sensing cycle, and a gain of the second sensor using at least one setting value for compensation for environmental variation before sensing by the at least one second sensor.

In S730, the first sensing value is compensated by adding or subtracting the preprocessed second sensing value with respect to the first sensing value.

In S720, compensation may be performed using each of the sensing values of the at least one second sensor. However, compensation in S720 is different from the multistage compensation described with reference to FIGS. 1 to 4 and FIG. 6. That is, the multistage compensation described with reference to FIGS. 1 to 4 and FIG. 6 includes the step of preprocessing using the compensation values for the sensing values of each of the sensors, whereas compensation using each of the sensing values of the at least one second sensor in S720 is performed through adjustment of the sensing condition of each of the sensors.

Although there is a difference in determination of the compensation values and the setting values, both compensation processes are identical in that more accurate touch sensing values are output by compensating for one touch sensor plural times.

The proximity sensor having improved environmental compensation performance and the environmental compensation method in the proximity sensor according to the present disclosure allow more accurate compensation not only for linearly varying environmental factors but also for non-linearly varying environmental factors.

Application of compensation for the touch sensing values through multistage compensation described with reference to FIGS. 1 to 4 and FIG. 6 to the non-linearly varying environmental factors may be performed by selecting different compensation values depending upon the degree of variation in the environmental factors, in which the compensation values are applied to the preprocessing step.

Application of compensation for the touch sensing values through adjustment of the sensor features using the setting values described with reference to FIGS. 5 and 7 to the non-linearly varying environmental factors may be performed by selecting different setting values depending upon the degree of variation in the environmental factors.

The above embodiments may be implemented individually or in combination thereof. In addition, it should be understood that these embodiments are provided for illustration only and are not to be construed in any way as limiting the present disclosure, and that various changes, modifications and alterations can be made by those skilled in the art without departing from the spirit and scope of the present disclosure. Therefore, other implementations, other embodiments, and equivalents of the appended claims fall within the scope of the appended claims.

What is claimed is:

1. An environmental compensation method in a proximity sensor, the method comprising:
   sensing, by a first sensor, a first sensing value;
   sensing, by a second sensor, a second sensing value;
   preprocessing the second sensing value;
   sensing, by a third sensor, a third sensing value;
   preprocessing the third sensing value;

compensating for the first sensing value by adding or subtracting the preprocessed second sensing value with respect to the first sensing value; and re-compensating for the first sensing value by adding or subtracting the preprocessed third sensing value with respect to the compensated first sensing value, wherein:

the first sensor is a touch sensor;

the second sensor comprises an internal sensor disposed inside the proximity sensor and adapted to sense internal environmental factors around a processor; and the third sensor comprises an external sensor outside of the proximity sensor and adapted to sense external environmental factors, wherein the second sensor and the third sensor are spatially separated from each other so as to sense different environmental variations.

2. The environmental compensation method according to claim 1, wherein each of the second sensor and the third sensor is provided in plural to allow each of preprocessing the second sensing value, preprocessing the third sensing value, compensating for the first sensing value, and re-compensating for the first sensing value to be performed plural times.

3. A proximity sensor having improved environmental compensation performance, comprising:

a processor; and a non-temporary memory storing a command, wherein, when operated by the processor, the command cause the processor to be configured to:

sense, by a first sensor, a first sensing value;

sense, by a second sensor, a second sensing value;

preprocess the second sensing value;

sense, by a third sensor, a third sensing value;

preprocess the third sensing value;

compensate for the first sensing value by adding or subtracting the preprocessed second sensing value with respect to the first sensing value; and re-compensate for the first sensing value by adding or subtracting the preprocessed third sensing value with respect to the compensated first sensing value, wherein:

the first sensor is a touch sensor;

the second sensor comprises an internal sensor disposed inside the proximity sensor and adapted to sense internal environmental factors around a processor; and the third sensor comprises an external sensor outside of the proximity sensor and adapted to sense external environmental factors, wherein the second sensor and the third sensor are spatially separated from each other so as to sense different environmental variations.

4. The proximity sensor according to claim 3, wherein each of the second sensor and the third sensor is provided in plural to allow each of preprocessing the second sensing value, preprocessing the third sensing value, compensating for the first sensing value, and re-compensating for the first sensing value by the processor to be performed plural times.

5. An environmental compensation method in a proximity sensor, the method comprising:

sensing, by a first sensor, a first sensing value;

sensing, by at least one second sensor, at least one second sensing value; and compensating for the first sensing value by adding or subtracting the preprocessed second sensing value with respect to the first sensing value, wherein sensing the second sensing value comprises: adjusting at least one sensor feature selected from among a sensing time, a sensing cycle, and a gain of the second sensor using at least one setting value for compensation for environmental variation before sensing by the second sensor.

6. The environmental compensation method according to claim 5, wherein the second sensor is provided in plural such that the second sensors are spatially separated from each other so as to sense different environmental variations.

7. The environmental compensation method according to claim 6, wherein the first sensor is a touch sensor; and the plural second sensors comprise an internal sensor adapted to sense internal environmental factors around a processor disposed inside the proximity sensor, and an external sensor adapted to sense external environmental factors outside the proximity sensor.

8. The environmental compensation method according to claim 5, wherein adjusting at least one sensor feature is performed using a setting table having previous stored setting values, the setting table storing different setting values depending upon a degree of environmental variation.

9. A proximity sensor having improved environmental compensation performance, comprising:

a processor; and a non-temporary memory storing a command, wherein, when operated by the processor, the command cause the processor to be configured to:

sense, by a first sensor, a first sensing value;

sense, by at least one second sensor, at least one second sensing value; and compensate for the first sensing value by adding or subtracting the preprocessed second sensing value with respect to the first sensing value, wherein sensing the second sensing value comprises: adjusting at least one sensor feature selected from among a sensing time, a sensing cycle, and a gain of the second sensor using at least one setting value for compensation for environmental variation before sensing by the second sensor.

10. The proximity sensor according to claim 9, wherein the second sensor is provided in plural such that the second sensors are spatially separated from each other so as to sense different environmental variations.

11. The proximity sensor according to claim 10, wherein the first sensor is a touch sensor; and the plural second sensors comprise an internal sensor adapted to sense internal environmental factors around the processor disposed inside the proximity sensor, and an external sensor adapted to sense external environmental factors outside the proximity sensor.

12. The proximity sensor according to claim 9, wherein adjusting at least one sensor feature by the processor is performed using a setting table having previous stored setting values, the setting table storing different setting values depending upon a degree of environmental variation.

* * * * *